US010584071B2

(12) United States Patent
Yang et al.

(10) Patent No.: US 10,584,071 B2
(45) Date of Patent: Mar. 10, 2020

(54) HEAT-DISSIPATING CERAMIC FOAM CONTAINING CARBONIZED CELLULOSE PARTICLES AND METHOD FOR PRODUCING THE SAME

(71) Applicant: Pukyong National University Industry-University Cooperation Foundation, Busan (KR)

(72) Inventors: Hyun Kyoung Yang, Busan (KR); Joo Hyun Lee, Busan (KR)

(73) Assignee: OSANG M&ET CO., LTD, Busan (KR)

( * ) Notice: Subject to any disclaimer, the term of this patent is extended or adjusted under 35 U.S.C. 154(b) by 0 days.

(21) Appl. No.: 15/764,057

(22) PCT Filed: Mar. 29, 2016

(86) PCT No.: PCT/KR2016/003191
§ 371 (c)(1),
(2) Date: Mar. 28, 2018

(87) PCT Pub. No.: WO2017/082487
PCT Pub. Date: May 18, 2017

(65) Prior Publication Data
US 2018/0282232 A1 Oct. 4, 2018

(30) Foreign Application Priority Data

Nov. 10, 2015 (KR) .................. 10-2015-0157446

(51) Int. Cl.
*C04B 38/02* (2006.01)
*C04B 18/24* (2006.01)
(Continued)

(52) U.S. Cl.
CPC ............ *C04B 38/02* (2013.01); *C04B 18/248* (2013.01); *C04B 28/26* (2013.01); *C04B 33/04* (2013.01);
(Continued)

(58) Field of Classification Search
CPC ........ C04B 38/02; C04B 38/06; F28F 13/003; F28F 21/02; F28F 21/04; F28F 2255/06; H05K 7/2039; C09K 5/14
See application file for complete search history.

(56) References Cited

U.S. PATENT DOCUMENTS 4,084,980 A * 4/1978 Motoki .................. C04B 28/00
106/601
4,328,136 A * 5/1982 Blount ............... C08G 18/6492
106/164.51

(Continued)

FOREIGN PATENT DOCUMENTS

JP 3023510 4/1996
JP 2002250088 A 9/2002
(Continued)

OTHER PUBLICATIONS

International Search Report for PCT/KR2016/003191, dated Sep. 23, 2016.

*Primary Examiner* — Noah S Wiese
(74) *Attorney, Agent, or Firm* — Norton Rose Fulbright US LLP

(57) ABSTRACT

The present disclosure provides a method for producing a heat-dissipating ceramic foam containing carbonized cellulose particles, the method including: mixing particles of carbonized cellulose or carbonized cellulose-containing substance, ceramic powders, silicate, and water to form slurry; adding a foaming agent to the slurry to form foamed slurry; and drying the foamed slurry.

5 Claims, 3 Drawing Sheets

(51) Int. Cl.
  *C04B 35/636* (2006.01)
  *C04B 35/18* (2006.01)
  *C04B 35/14* (2006.01)
  *C04B 35/52* (2006.01)
  *C04B 33/135* (2006.01)
  *C04B 33/04* (2006.01)
  *C04B 28/26* (2006.01)
  *C04B 33/132* (2006.01)
  *C09K 5/14* (2006.01)
  *F28F 13/00* (2006.01)
  *F28F 21/02* (2006.01)
  *F28F 21/04* (2006.01)
  *H05K 7/20* (2006.01)
  *H01L 33/64* (2010.01)

(52) U.S. Cl.
  CPC .......... *C04B 33/132* (2013.01); *C04B 33/135* (2013.01); *C04B 35/14* (2013.01); *C04B 35/18* (2013.01); *C04B 35/522* (2013.01); *C04B 35/6365* (2013.01); *C09K 5/14* (2013.01); *F28F 13/003* (2013.01); *F28F 21/02* (2013.01); *F28F 21/04* (2013.01); *H05K 7/2039* (2013.01); *C04B 2235/40* (2013.01); *C04B 2235/402* (2013.01); *C04B 2235/405* (2013.01); *C04B 2235/408* (2013.01); *C04B 2235/80* (2013.01); *F28F 2255/06* (2013.01); *H01L 33/641* (2013.01)

(56) References Cited

U.S. PATENT DOCUMENTS

2008/0096018 A1* 4/2008 Zhang ............... C03C 10/00
                                                    428/402
2009/0146108 A1* 6/2009 Datta ............... C03C 11/002
                                                    252/378 R

FOREIGN PATENT DOCUMENTS

| | | | | |
|---|---|---|---|---|
| JP | 2002305966 A | | 10/2002 | |
| JP | 2003-020290 | * | 1/2003 | ............. C04B 38/06 |
| JP | 2003020290 A | | 1/2003 | |
| KR | 2007-100760040 | * | 9/2007 | ............. C04B 35/20 |
| KR | 100760040 B1 | | 9/2007 | |
| KR | 100955622 B1 | | 5/2010 | |
| KR | 101220726 B1 | | 1/2013 | |

* cited by examiner

HEAT-DISSIPATING CERAMIC FOAM CONTAINING CARBONIZED CELLULOSE PARTICLES AND METHOD FOR PRODUCING THE SAME

CROSS-REFERENCE TO RELATED APPLICATIONS

This application is a national phase application under 35 U.S.C. § 371 of International Application No. PCT/KR2016/003191 filed Mar. 29, 2016, which claims the benefit of priority of Republic of Korea Patent Application No. 10-2015-0157446 filed Nov. 10, 2015. The contents of each of the above-referenced applications are incorporated into the present application by reference.

FIELD

The present disclosure relates to a heat-dissipating ceramic foam containing particles of carbonized cellulose or carbonized cellulose-containing substance such as coffee grounds and a method for producing the same.

BACKGROUND

With weight reduction, thinning, miniaturization and multi-functionalization of electronic devices, an integration degree thereof increases. Thus, much heat is generated therefrom, and, thus, problems such as malfunction caused by heat. Hence, there is interest and research on the heat release of the electronic devices.

A heat sink is used for heat dissipation. The heat sink may use a principle that when two substances contact each other, the substances distribute heat energy thereof to each other and eventually reach a thermal equilibrium. Thus, the heat sink may receive a strong heat of a heat source and lower the temperature of the heat source. In general, the heat sink is made of aluminum, which has a good thermal conductivity, and is formed into a shape of a fin to maximize a conducting surface area to enable maximum contact with a surrounding air to dissipate the heat by natural convection. However, there is a problem in that it takes a lot of time and cost to fabricate the heat sink. The heat sink may have a heavy weight depending on the metal and a limitation of the surface area size due to manufacturing limitations.

A ceramic foam is widely used as a heat insulating material based on excellent properties of ceramics such as thermal stability, superior mechanical strength, low density, light weight and ability to contain air in pores. However, even with the excellent properties of ceramics and the large surface area thereof, the ceramic foam has not served as the heat dissipating means because of the low thermal conductivity of the ceramic.

SUMMARY

The present inventor has recognized the above-mentioned conventional problems and thus provided a ceramic foam which may be used as the heat dissipating means, and a method for producing the foam.

In one aspect, the present disclosure provides a method for producing a heat-dissipating ceramic foam containing carbonized cellulose particles including: mixing particles of carbonized cellulose or carbonized cellulose-containing substance, ceramic powders, silicate, and water to form slurry; adding a foaming agent to the slurry to form foamed slurry; and drying the foamed slurry.

The cellulose is a major constituent of vegetable cell walls and is found in wood, cotton, and grains. The present disclosure uses particles of carbonized cellulose or carbonized cellulose-containing substance rather than cellulose or cellulose-containing substance itself. The particles of carbonized cellulose or carbonized cellulose-containing substance refer to particles of cellulose or carbonized cellulose-containing substance as carbonized by heat.

The particles of the carbonized cellulose or carbonized cellulose-containing substance include coffee grounds. In this connection, the coffee grounds refer to residues of roasted coffee beans after coffee is extracted therefrom. An example thereof may be coffee puck of espresso.

The ceramic powders, for example, include at least one selected from a group consisting of elvan, ocher stone, olivine, kaolin, silica mineral, diatomite, wollastonite, pyrophyllite, dolomite, lithium minerals, magnesite, bauxite, bentonite, pumice, borate, serpentine, acid clay, iron oxide, garnet, carbonate minerals, attapulgite, sepiolite, nephrite, apatite, illite-mica, feldspar, perlite, vermiculite, zeolite, barite, talc, diatomaceous earth, graphite, hectorite, clay minerals, zirconium minerals, titanium minerals, tourmaine, fume silica, aerogel, fly ash, and blast furnace slag. However, the present disclosure is not limited thereto.

The silicate may include at least one selected from a group consisting of sodium silicate, powdered sodium silicate, potassium silicate, lithium silicate, and sodium aluminosilicate. The present invention is not limited thereto.

The foaming agent may be calcium carbonate, sodium bicarbonate or hydrogen peroxide. As long as the foaming agent is added in the slurry and forms pores in the slurry, the foaming agent is not limited to the above-listed material.

Mixing the particles of carbonized cellulose or carbonized cellulose-containing substance, ceramic powder, silicate, and water may include mixing the particles of carbonized cellulose or carbonized cellulose-containing substance, ceramic powder, silicate, water, and metal powders, wherein the metal powders include at least one selected from a group consisting of Au, Ag, Zn, Al, Fe, Mg and Sn.

Mixing the particles of carbonized cellulose or carbonized cellulose-containing substance, ceramic powder, silicate, and water may include mixing the particles of carbonized cellulose or carbonized cellulose-containing substance, ceramic powder, silicate, water, and activated carbons. The activated carbon may include activated charcoal. The activated carbon may be added to the ceramic foam of the present disclosure to improve mechanical strength and thermal conductivity of the foam.

In another aspect, the present disclosure provides a heat-dissipating ceramic foam including particles of carbonized cellulose or carbonized cellulose-containing substance.

The particles of carbonized cellulose or carbonized cellulose-containing substance may include coffee grounds.

The foam may further include metal powders, wherein the metal powers may include at least one selected from a group consisting of gold, silver, Zn, Al, Fe, Mg, and Sn.

The foam may further include activated carbons.

The ceramic foam in accordance with the present disclosure has a surface area that is much larger than that of a conventional heat-dissipating material, thereby to have a spacious contact area with air. In addition, the present ceramic foam has superior heat conduction characteristics to the conventional ceramic foam. Thus, the present foam may provide excellent heat dissipation.

Further, in order to improve the heat conduction property, cellulose carbides such as coffee grounds are contained in the foam rather than thermally conductive particles such as general metal particles or carbon particles. Thus, the present foam has sufficient mechanical strength while having compact pores.

In addition, when the coffee grounds are used as the cellulose carbide, the coffee grounds that otherwise only is used for deodorizing purposes might be recycled. The coffee grounds may be obtained by roasting of coffee beans including carbonization and granulation by pulverization, and by removal of unnecessary components by extraction. In this way, any separate process for forming the carbonized cellulose particles may be removed.

DETAILED DESCRIPTIONS

Examples of various embodiments are illustrated and described further below. It is intended to cover alternatives, modifications, and equivalents as may be included within the spirit and scope of the present disclosure as defined by the appended claims. Examples of various embodiments are illustrated and described further below. It will be understood that the description herein is not intended to limit the claims to the specific embodiments described. The same reference numbers in different figures denote the same or similar elements, and as such work similar functionality.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

1. Preparation and Physical Properties Evaluation of Foam

Example 1

Figure 1:
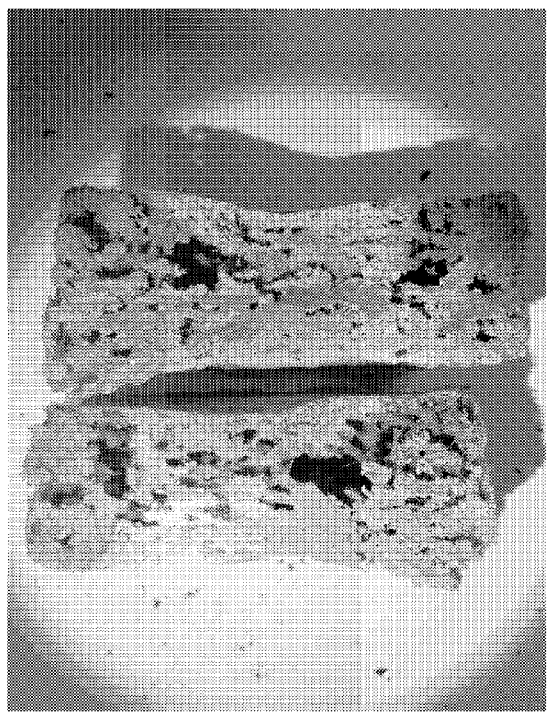
FIG. 1 to FIG. 4 are photographs illustrating foaming agents prepared in Example 1 to Example 4, respectively.

5 g of silica, 2 g of aluminum powder, 12.5 g of PVA, 20 ml of liquid silicate, and 15 ml of water were mixed to form slurry. 1 ml of hydrogen peroxide was added to the slurry to foam the slurry. The foamed slurry was heated at 100° C. for 10 hours and dried to obtain a foam as shown in FIG. 1.

The foam obtained in Example 1 was easily broken and has small pores and large pores coexisted therein. Thus, the pores were not uniform or dense. A large pore region in which particle-to-particle bonds were not formed was observed.

Example 2

Figure 2:
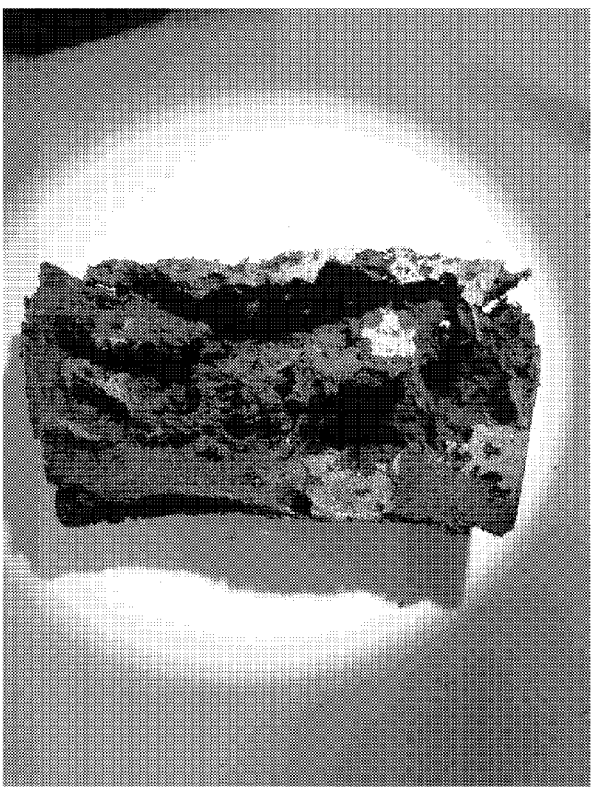

A foam was prepared in the same manner as in Example 1 except that 12.5 g of graphite was added for slurry preparation. The thus-prepared foam is shown in FIG. 2.

In the foam obtained in Example 2, only large pores were present. The foam was easily broken when it was pressed down strongly. From this, it was found that the foam having sufficient strength and sufficient porosity could not be prepared only when the carbon particles were added to increase the thermal conductivity.

Example 3

Figure 3:
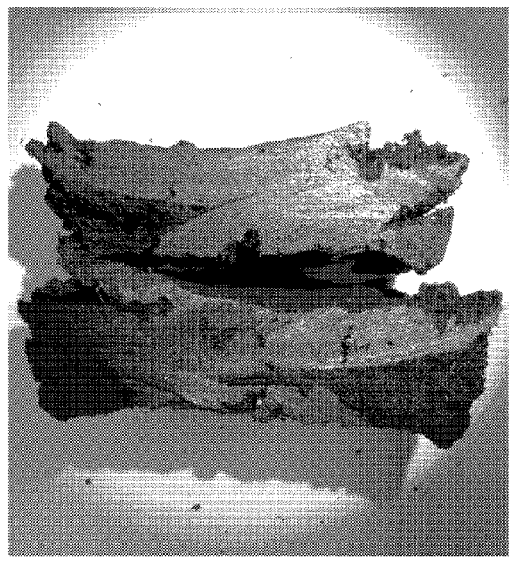

A foam was prepared in the same manner as in Example 2 except that 12.5 g of activated carbons were added instead of graphite. The thus-prepared foam is shown in FIG. 3.

It was confirmed that the foam obtained in Example 3 had insufficient pores as a whole. The foam had a strong strength so that it did not break even when it was thrown down.

Example 4

Figure 4:
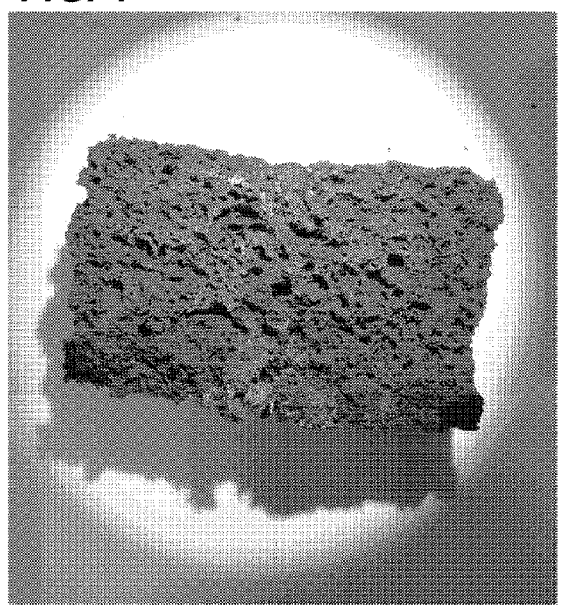

A foam was prepared in the same manner as in Example 2 except that 12.5 g of coffee grounds were added instead of graphite. The thus-prepared foam is shown in FIG. 4.

The foam obtained in Example 4 had a small pore size and a uniform pores distribution. The pore size was about 2 mm. The foam had enough strength not to be broken even when it was dropped down from 80 cm height above.

2. Evaluation of Heat Sink Characteristics of Prepared Foam

The heat sink characteristics of the foams as prepared in the above Examples were evaluated. After the foams prepared in the above Examples were attached to the LED chips respectively, the temperature of the foams and the LED chips 15 minutes after supply of power to the LED chips were measured with a thermal imaging camera.

FIG. 5A to FIG. 8B correspond to the foams of Example 1 to Example 4, respectively.

Figure 5A:
FIG. 5A to FIG. 8B are photographs of the foams as taken by a thermal imaging camera, wherein the foams prepared in Example 1 to Example 4 are attached to LED chips respectively.
Figure 5B:
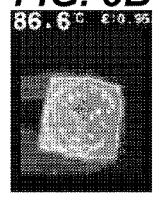
Figure 6A:
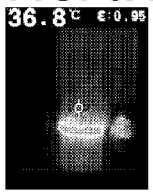
Figure 6B:
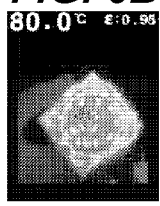
Figure 7A:
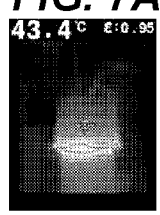
Figure 7B:
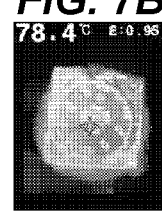
Figure 8A:
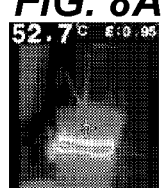
Figure 8B:

FIG. 5B shows the temperature of the LED chip which is attached to the foam prepared in Example 1 as measured by the thermal imaging camera. The measured temperature was 86.6° C. FIG. 6B shows the temperature of the LED chip which is attached to the foam prepared in Example 2 as measured by the thermal imaging camera. The measured temperature was 80.0° C. FIG. 7B shows the temperature of the LED chip which is attached to the foam prepared in Example 3 as measured by the thermal imaging camera. The measured temperature was 78.4° C. FIG. 8B shows the temperature of the LED chip which is attached to the foam prepared in Example 4 as measured by the thermal imaging camera. The measured temperature was 75.2° C. From those, it was confirmed that the foam prepared in Example 4 containing coffee grounds exhibits the optimal performance as the heat sink.

In particular, the optimal performance is proven by the measurements of the temperatures of the foams. FIG. 5A illustrates a temperature measurement of the foam of Example 1 with the thermal imaging camera. The temperature measurement thereof is 29.5° C. FIG. 6A illustrates a temperature measurement of the foam of Example 2 with the thermal imaging camera. The temperature measurement thereof is 36.8° C. FIG. 7A illustrates a temperature measurement of the foam of Example 3 with the thermal imaging camera. The temperature measurement thereof is 43.4° C. FIG. 8A illustrates a temperature measurement of the foam of Example 4 with the thermal imaging camera. The temperature measurement thereof is 52.7° C. From those, it was confirmed that the foam prepared in Example 4 containing coffee grounds exhibits a highest heat dissipation rate from the LED chip.

What is claimed is:

1. A method for producing a heat-dissipating ceramic foam containing coffee grounds comprising cellulose carbides and having uniform size and distribution of pores, the method comprising:
    mixing coffee grounds comprising cellulose carbides, ceramic powders, silicate, and water to form slurry;
    adding hydrogen peroxide to the slurry to form foamed slurry; and
    drying the foamed slurry.

2. The method of claim 1, wherein the ceramic powder includes at least one selected from a group consisting of elvan, ocher stone, olivine, kaolin, silica mineral, diatomite, wollastonite, pyrophyllite, dolomite, lithium minerals, magnesite, bauxite, bentonite, pumice, borate, serpentine, acid clay, iron oxide, garnet, carbonate minerals, attapulgite, sepiolite, nephrite, apatite, illite-mica, feldspar, perlite, vermiculite, zeolite, barite, talc, diatomaceous earth, graphite, hectorite, clay minerals, zirconium minerals, titanium minerals, tourmaine, fume silica, aerogel, fly ash, and blast furnace slag.

3. The method of claim 1, wherein the silicate includes at least one selected from a group consisting of sodium silicate, powdered sodium silicate, potassium silicate, lithium silicate, and sodium alumino-silicate.

4. The method of claim 1, wherein mixing includes mixing the coffee grounds comprising cellulose carbides, ceramic powder, silicate, water, and metal powders, wherein the metal powders include at least one selected from a group consisting of Au, Ag, Zn, Al, Fe, Mg and Sn.

5. The method of claim 1, wherein mixing includes mixing the coffee grounds comprising cellulose carbides, ceramic powder, silicate, water, and activated carbons.

* * * * *